United States Patent [19]

Inoue

[11] 4,365,218
[45] Dec. 21, 1982

[54] THREE TERMINAL TYPE PIEZOELECTRIC FILTER

[75] Inventor: Jiro Inoue, Kanazawa, Japan

[73] Assignee: Murata Manufacturing Co., Ltd., Japan

[21] Appl. No.: 232,403

[22] Filed: Feb. 6, 1981

[30] Foreign Application Priority Data

Feb. 14, 1980 [JP] Japan .................... 55-17263

[51] Int. Cl.³ .................... H03H 9/15; H03H 9/54
[52] U.S. Cl. .................... 333/187; 310/366
[58] Field of Search .................... 333/187–191; 310/365–366, 367–369

[56] References Cited

U.S. PATENT DOCUMENTS 2,969,512  1/1961  Jaffe et al. .................... 333/187
3,638,146  1/1972  Takaku et al. .................... 333/187
4,066,986  1/1978  Takano et al. .................... 310/366 X Primary Examiner—Marvin L. Nussbaum
Attorney, Agent, or Firm—Ostrolenk, Faber, Gerb & Soffen

[57] ABSTRACT

A piezoelectric filter of three terminal type which includes a piezoelectric substrate having one main surface at its one face and the other main surface at its other surface, an input electrode and an output electrode respectively provided on the one main surface of the piezoelectric substrate and a common electrode provided on the other main surface of the piezoelectric substrate. The output electrode is provided so as to face or confront the input electrode in a spaced relation from the input electrode, while the common electrode is arranged selectively not to confront, or to confront, to a certain extent at its peripheral edge portion, the output electrode through the piezoelectric substrate.

12 Claims, 12 Drawing Figures

THREE TERMINAL TYPE PIEZOELECTRIC FILTER

BACKGROUND OF THE INVENTION

The present invention generally relates to an electrical filter and more particularly, to a piezoelectric filter of a three terminal type superior in spurious characteristics.

Referring to FIGS. 1 and 2 showing a prior art piezoelectric filter element of three terminal type (referred to as merely a three terminal type piezoelectric filter hereinbelow) utilizing the breathing or expansion mode vibration of a rectangular plate, the known piezoelectric filter F generally comprises a piezoelectric ceramic base plate or substrate B in a configuration of a parallelogram, an input electrode Ei also in a configuration of a parallelogram formed at approximately a central portion of one main surface of the piezoelectric substrate B, an output electrode Eo formed along the peripheral edges of the one main surface of the substrate B so as to surround the corresponding peripheral edges of the input electrode Ei, and a common electrode Ec formed on the other main surface of the substrate B.

For reference, there is shown in FIG. 3 an example of a circuit employing one element of the three terminal type piezoelectric filter F as described above, in which circuit, an AM-front end C1 is coupled to an AM detection circuit C2 through an intermediate frequency transformer IFT and the piezoelectric filter F, while spurious characteristics upon combination of the intermediate frequency transformer IFT and the piezoelectric filter F as in FIG. 3 are represented in a graphical form in FIG. 4.

As is seen from FIG. 4, in the conventional three terminal type piezoelectric filter F as described with reference to FIGS. 1 and 2, a spurious response due to the edge mode vibration is noticed in the vicinity of 650 KHz, and thus, there have been cases where troubles or interferences due to "beat" are brought into question during reception especially in radio sets for receiving long wave band regions.

SUMMARY OF THE INVENTION

Accordingly, an essential object of the present invention is to provide an improved three terminal type piezoelectric filter which utilizes expansion mode vibration effective for supressing spurious response due to edge mode vibration.

Another important object of the present invention is to provide an improved three terminal type piezoelectric filter as described above which is especially adapted to vibrate primarily in an expansion mode and which is characterized in the size of a common electrode provided on the other main surface of a piezoelectric substrate and in which the common electrode is arranged to confront less than the entire output electrode through the piezoelectric substrate so that stray capacity between the input and output sides reaches a value higher than a required value, with parallel equivalent capacity at the output side being below a required value, upon consideration of an equivalent circuit.

A further object of the present invention is to provide a three terminal type piezoelectric filter as described above which is simple in construction and accurate in functioning, and can be manufactured on a large scale at low cost.

In accomplishing these and other objects according to one preferred embodiment of the present invention, there is provided a piezoelectric filter of three terminal type which is especially adapted to vibrate primarily in an expansion mode and which comprises a piezoelectric substrate, for example, of a rectangular or parallelogram configuration having one main surface at its one face and the other main surface at the other face thereof, an input electrode and an output electrode respectively provided on the one main surface of the piezoelectric substrate, and a common electrode provided on the other main surface of the piezoelectric substrate. The input electrode also has a rectangular or parallelogram configuration and is provided in the vicinity of the central portion of the one main surface, while the output electrode is provided adjacent to peripheral edges of the one main surface in a concentrically spaced relation with respect to the input electrode. The common electrode of a corresponding rectangular or parallelogram configuration provided on the other main surface is arranged to confront, less than the entire output electrode through the piezoelectric substrate.

By the arrangement according to the present invention as described above, an improved three terminal type piezoelectric filter has been advantageously presented, with substantial elimination of disadvantages inherent in the conventional three terminal type piezoelectric filters of this kind.

BRIEF DESCRIPTION OF THE DRAWINGS

These and other objects and features of the present invention will become apparent from the following description taken in conjunction with the preferred embodiment thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 5:
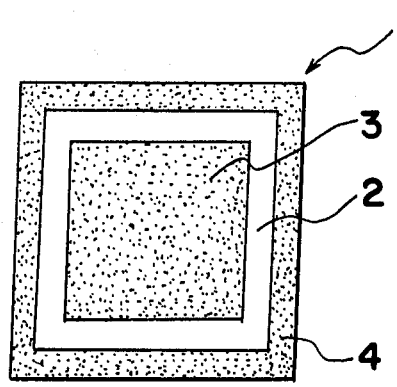
FIG. 5 is a top plan view of an improved three terminal type piezoelectric filter according to one preferred embodiment of the present invention.
Figure 6:
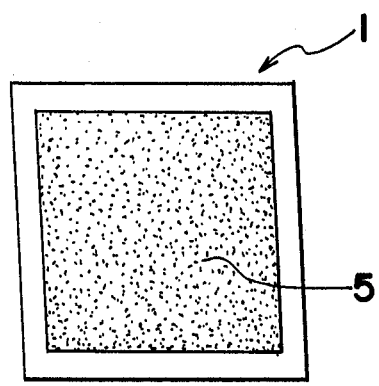
FIG. 6 is a bottom plan view of the improved three terminal type piezoelectric filter of FIG. 5.

Referring now to the drawings, there is shown in FIGS. 5 and 6 a piezoelectric filter element of three terminal type according to one preferred embodiment of the present invention which utilizes the expansion mode vibration of a rectangular plate. The piezoelectric filter 1 of FIGS. 5 and 6 generally comprises a piezoelectric ceramic base plate or substrate 2, for example, in a configuration of a rectangle or parallelogram, an input electrode 3 also in a configuration of a rectangle or parallelogram formed or deposited at approximately a central portion of one main surface of the piezoelectric substrate 2, an output electrode 4 formed or deposited along the peripheral edges of the one main surface of the substrate 2 so as to surround the corresponding peripheral edges of the input electrode 3 in a concentrically spaced relation with respect to said input electrode 3, and a common electrode 5 formed or deposited on the other main surface of the substrate 2. In the above embodiment, peripheral edges of said common electrode 5 are arranged to confront the inner peripheral edges of the output electrode 4 through the piezoelectric ceramic substrate 2. In other words, the common electrode 5 of the piezoelectric filter 1 of FIG. 6 according to the present invention has a smaller electrode area then the common electrode Ec of the conventional piezoelectric filter F of FIG. 2.

Figure 7:
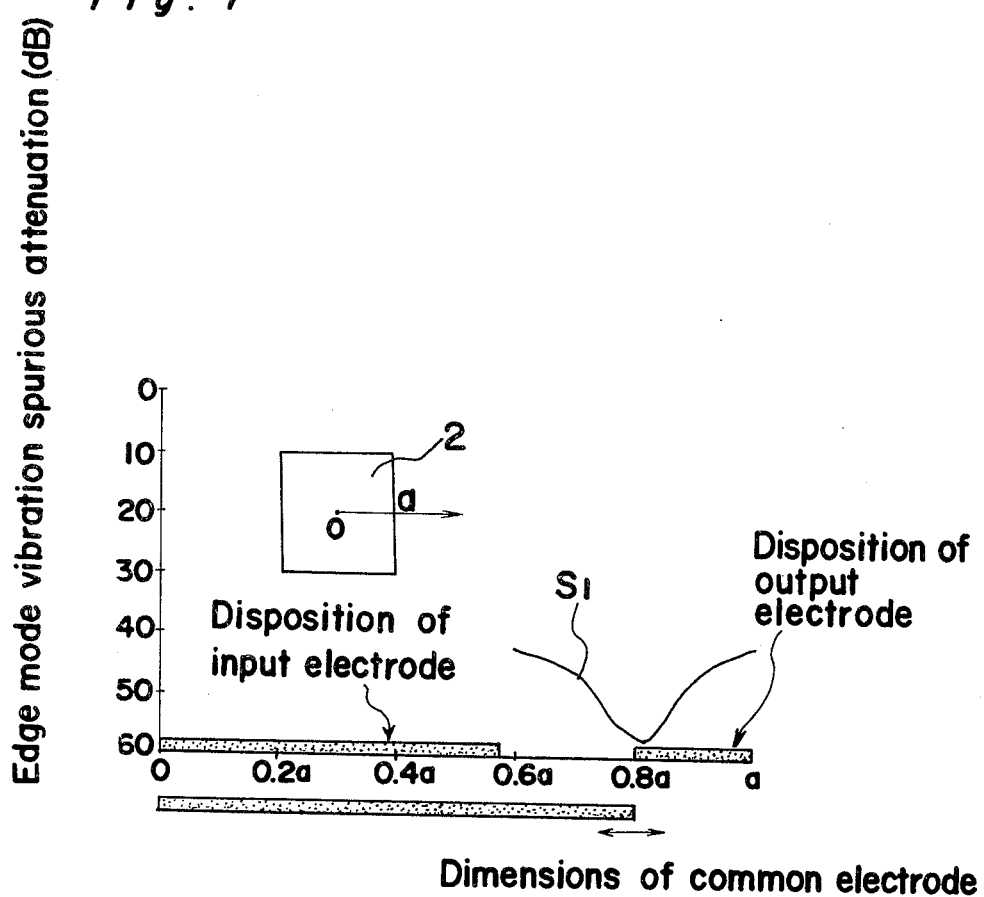
FIG. 7 is a graph showing the relation between the size of a common electrode and edge mode vibration spurious attenuation amount.

Referring also to FIG. 7, on the assumption that a distance between the center O of the piezoelectric ceramic substrate 2 and one peripheral edge of the common electrode 5 is represented by "a" in a direction from said center O to said peripheral edge, with the peripheral edge of the input electrode 3 being located at a distance 0.57a from the center O, and with the inner peripheral edge of the output electrode 4 being located at a distance 0.8a from the center O of said substrate 2, the amount of attenuation of spurious response due to the edge mode vibration is represented by a curve S1 in FIG. 7 when the distance at which the peripheral edge of the common electrode 5 is located, is varied within the range between 0.6a and "a".

As is seen from FIG. 7, the amount of the spurious response is reduced when the peripheral edges of the common electrode 5 confront the inner peripheral edges of the output electrode 4 through the piezoelectric ceramic substrate 2 or such peripheral edges of the common electrode 5 are located in the vicinity of the inner peripheral edges of the output electrode 4 through said substrate 2. The allowable range of dimensions and configurations of the common electrode 5 depends on the degrees of spurious response amounts preferable. For example, a common electrode which overlaps no more than one-half of the output electrode may often be desirable.

Figure 8:
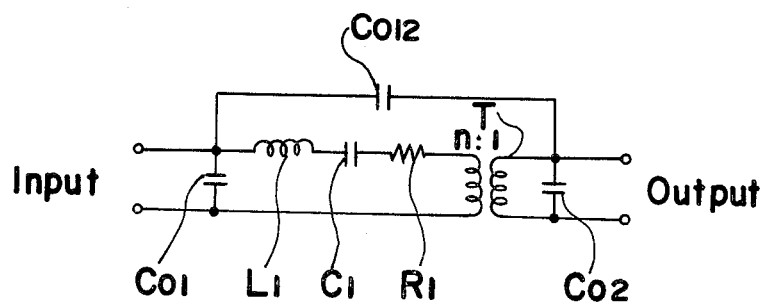
FIG. 8 is an electrical circuit diagram showing an equivalent circuit of the edge mode vibration spurious response.

Referring also to FIG. 8 showing an equivalent circuit of a three-terminal type piezoelectric filter, with particular attention directed to the spurious response owing to the edge mode vibration, the reason why such results as described above are obtained will be described hereinbelow.

Figure 1:
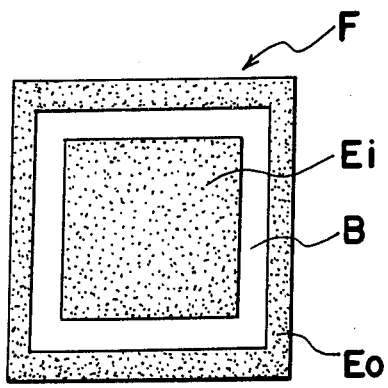
FIG. 1 is a top plan view of a conventional three terminal type piezoelectric filter (already referred to)
Figure 2:
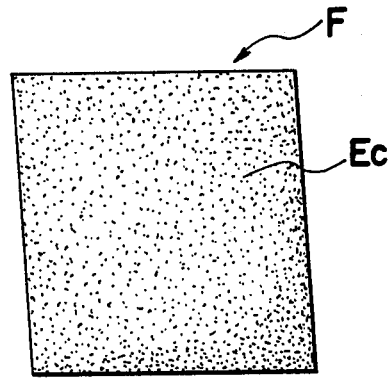
FIG. 2 is a bottom plan view of the conventional three terminal type piezoelectric filter of FIG. 1 (already referred to)
Figure 3:
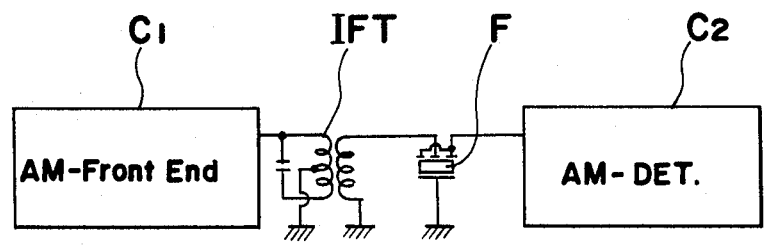
FIG. 3 is an electrical block diagram showing one example of application of the piezoelectric filter of FIG. 1 (already referred to)
Figure 9:
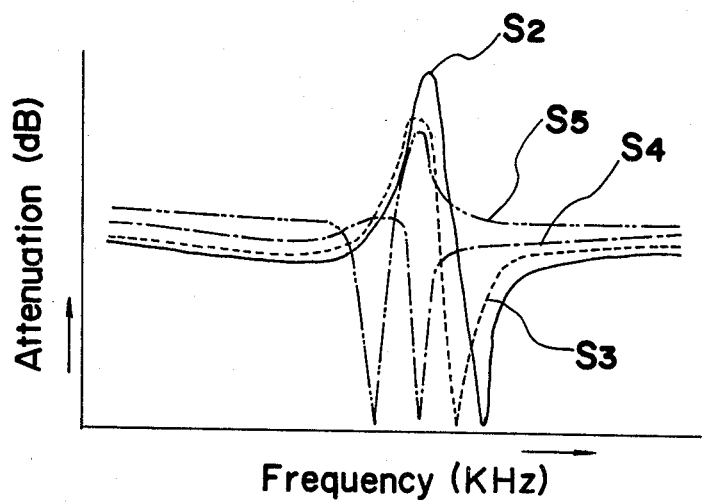
FIG. 9 is a diagram in graphical form showing the relation between the size of the common electrode and frequency having attenuation pole of the edge mode vibration spurious response.

In the equivalent of FIG. 8, the input side parallel equivalent capacity $C_{01}$ is coupled to a primary winding of an ideal transformer T having transformation ratio of n:1 and representing all of transducers and the like of mechanical and electrical systems at the input and output sides, through a series connection of an equivalent inductance $L_1$, an equivalent capacitance $C_1$ and an equivalent resistance $R_1$ of the mechanical resonance system, and also connected, through the stray capacity $C_{012}$ between the input and output sides, to the output side parallel equivalent capacity $C_{02}$ which is coupled to a secondary winding of the ideal transformer T. When the distance "a" from the center to the peripheral edge of the common electrode 5 is reduced to 0.8a, the output side parallel equivalent capacity $C_{02}$ is varied to a large extent from approximately 200 pF to several pF in the above embodiment. On the other hand, since the variations of other equivalent circuit constants are small, attenuation pole of the spurious radiation due to the edge mode vibration is shifted to lower frequency side as shown in FIG. 9, in which a curve S2 represents the case of the conventional filter F as shown in FIG. 2 having the common electrode Ec formed on the entire surface of the other main surface of the substrate B, a curve S3 denotes the case wherein the distance from the center to the peripheral edge of the common electrode 5 is 0.9a, a curve S4 represents the case wherein said distance is 0.8a, and a curve S5 shows the case wherein said distance is 0.7a. In FIG. 9, it is noticed that the spurious response reaches the smallest value through almost complete overlapping thereof with the pass band region of the edge mode vibration in the vicinity of the distance 0.8a or thereabout from the center to the peripheral edge of the common electrode 5. As the distance from the center to the peripheral edge of the common electrode 5 is further reduced, the stray capacity $C_{012}$ between the input and output sides and also the transformation ratio begin to be varied, with simultaneous shifting of the attenuation pole of the spurious response due to the edge mole vibration towards the region lower than the pass band region of the edge mode vibration, and consequent gradual increase of the spurious response amount.

The dimensions and configurations of the common electrode 5 are determined by the attenuation amount of the required spurious response, and therefore, of the other main surface of the piezoelectric substrate 2, in the area or region confronting the output electrode 4, there may be cases where no common electrode 5 is provided, where the common electrode 5 has a portion only slightly confronting the output electrode 4, or where a considerable portion of the common electrode 5 is arranged to confront the output electrode 4. Meanwhile, even on the assumption that the attenuation amount of the required spurious response is of a constant value, the dimensions, configurations and positional relations of the common electrode 5 may differ according to the materials of the piezoelectric substrate 2 employed or frequencies adopted, etc. In short, it is required that the parallel equivalent capacity $C_{02}$ at the output side and the stray capacity $C_{012}$ between the input and output sides should be within such a range of value which will not lose the respective functions thereof, i.e. the functions thereof as filters with respect to the expansion mode vibration. From the above point of view, the shapes of the common electrode or piezoelectric substrate need not necessarily be rectangular, but may be of any other configurations so long as the edge mode vibration can be produced.

Figure 10:
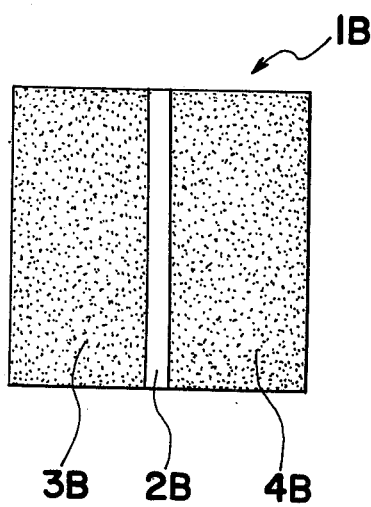
FIG. 10 is a view similar to FIG. 5, which particularly shows a modification thereof.
Figure 11:
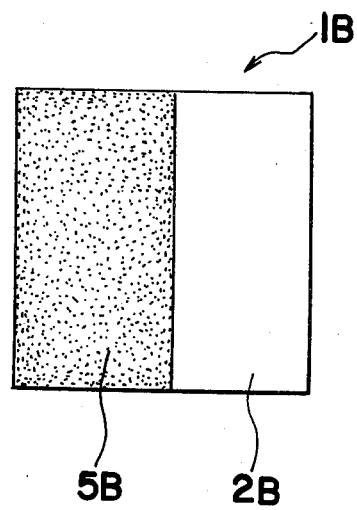
FIG. 11 is a bottom plan view of the modified three terminal type piezoelectric filter of FIG. 10.

Furthermore, it is to be noted that the input and output electrodes described as concentrically disposed in the embodiment of FIGS. 5 and 6 may be replaced by simple divided electrodes 3B and 4B provided on the one main surface of the substrate 2B of the filter 1B as shown in FIG. 10, with one electrode 3B functioning as an input electrode and the other electrode 4B as an output electrode. In the above case, in the other main surface of the substrate 2B, the modified common electrode 5B is provided as shown in FIG. 11 in such a manner as to satisfy the conditions described earlier.

Figure 4:
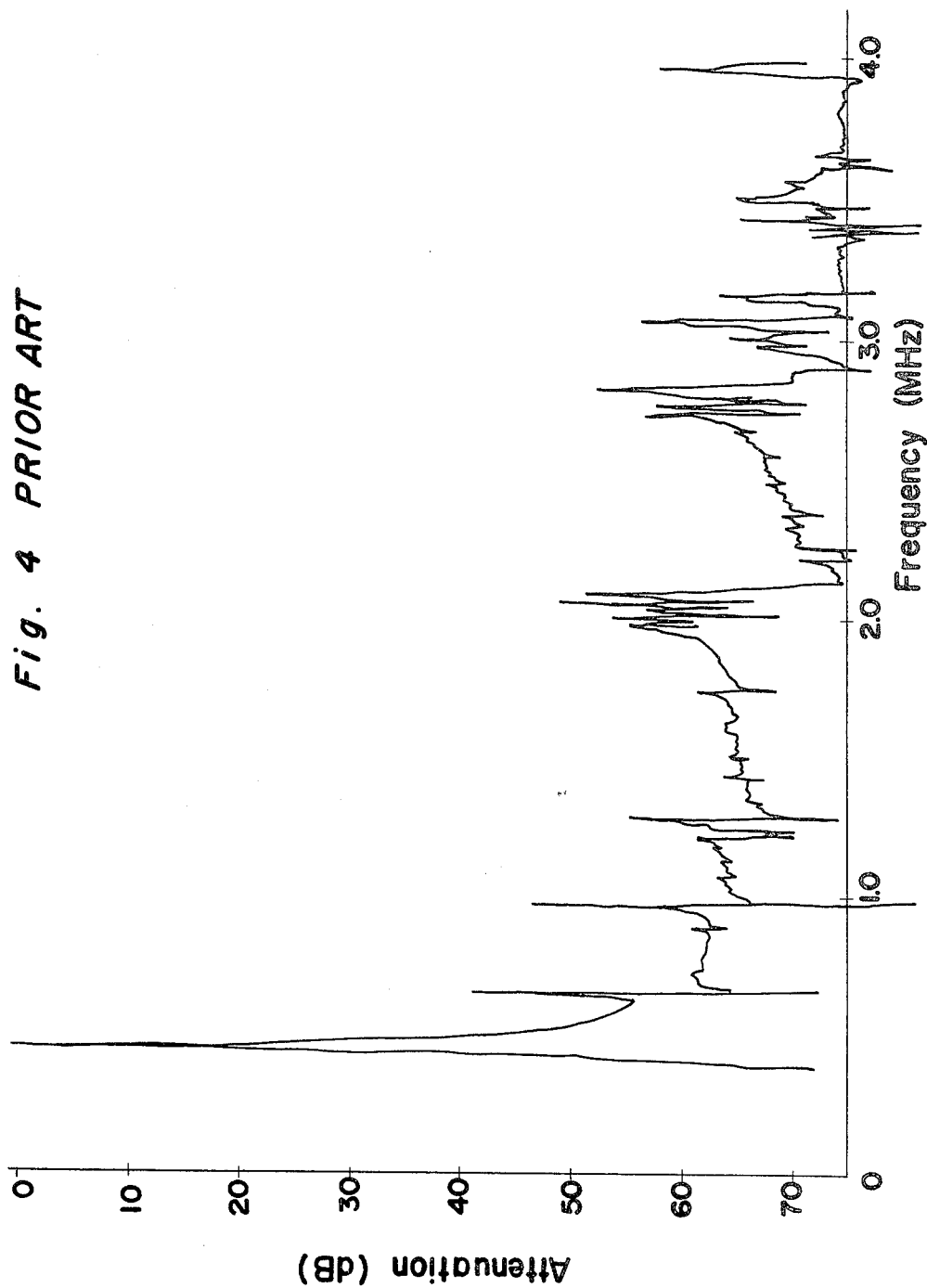
FIG. 4 is a graph illustrating spurious characteristics of the conventional three terminal type piezoelectric filter (already referred to)
Figure 12:
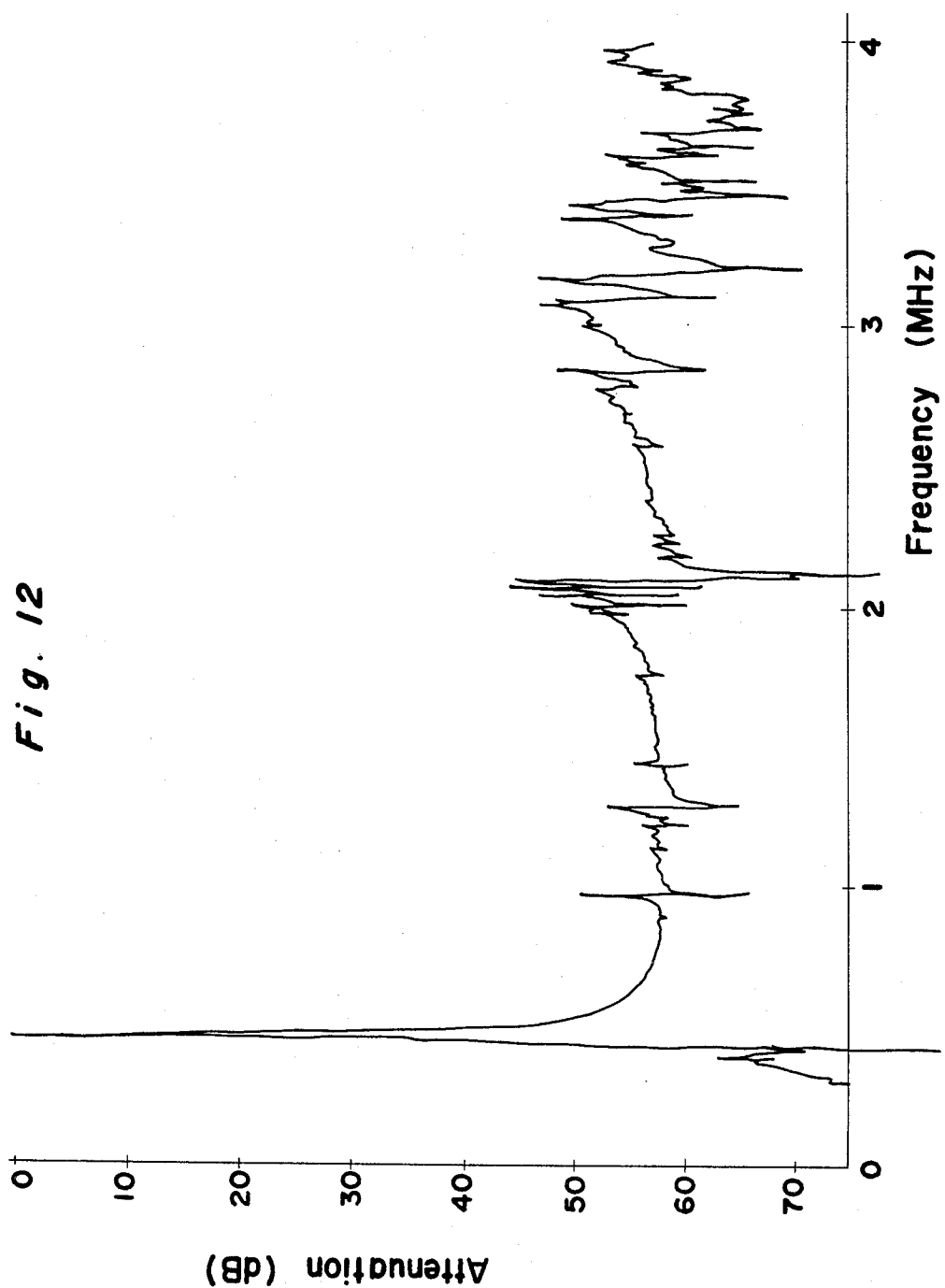
FIG. 12 is a graph showing spurious characteristics of the improved three terminal type piezoelectric filter according to the present invention.

Reference is made to FIG. 12 showing the spurious characteristics in the case where the distance from the center to the peripheral edge of the common electrode 5 is 0.8a. As is seen from FIG. 12, the spurious attenuation amount due to the edge mode vibration, which was in the region of approximately −40 to −44 dB upon combination of the intermediate frequency transformer IFT and conventional three terminal type piezoelectric filter as described with reference to FIG. 4, has been improved to approximately −56 to −58 dB.

As is clear from the foregoing description, according to the present invention, an improved three terminal type piezoelectric filter which utilizes the expansion mode vibration effectively for suppressing spurious response due to the edge mode vibration, has been advantageously presented through simple construction without any factors for cost increase, while simultaneously, employment of expensive silver electrode material may be reduced to comply with saving of resources strongly called for at present.

Although the present invention has been fully described by way of example with reference to the attached drawings, it is to be noted that various changes and modifications will be apparent to those skilled in the art. Therefore, unless otherwise such changes and modifications depart from the scope of the present invention, they should be construed as included therein.

What is claimed is:

1. A piezoelectric filter of three terminal type which is especially adapted to vibrate primarily in an expansion mode, said filter comprising:
a piezoelectric substrate having first and second opposed main surfaces;
an input electrode and an output electrode respectively provided on said first main surface of said piezoelectric substrate; and
a common electrode provided on said second main surface of said piezoelectric substrate, said common electrode confronting less than the entire said output electrode through said piezoelectric substrate whereby spurious edge mode vibrations which would otherwise be excited are suppressed.

2. A piezoelectric filter of three terminal type which is especially adapted to vibrate primarily in an expansion mode, said filter comprising:
a piezoelectric substrate having first and second opposed main surfaces;
an input electrode and an output electrode respectively provided on said first main surface of said piezoelectric substrate, said output electrode being spaced from said input electrode; and
a common electrode provided on said second main surface of said piezoelectric substrate, said common electrode confronting less than the entire said output electrode through said piezoelectric substrate whereby spurious edge mode vibrations which would otherwise be excited are supressed.

3. A piezoelectric filter as claimed in claim 2, wherein said input electrode is provided in the vicinity of the central portion of said first main surface of said piezoelectric substrate, and said output electrode is provided adjacent to the peripheral edge portion of said piezoelectric substrate so as to surround said input electrode in a concentric and spaced relation from said input electrode.

4. A piezoelectric filter as claimed in claim 3, wherein said piezoelectric substrate and said input electrode respectively have configurations of parallelograms concentrically provided on said first main surface, with said common electrode also having a configuration of a parallelogram.

5. A piezoelectric filter as claimed in claim 2, wherein said input electrode is provided at one side of said first main surface of said piezoelectric substrate, and output electrode is provided at the other side of said first main surface in a spaced relation from said input electrode.

6. A piezoelectric filter as claimed in claim 5, wherein said piezoelectric substrate has a configuration of a parallelogram, and said input electrode and output electrode having rectangular configurations so as to face in the spaced relation from each other at the central portion of said one main surface, with said common electrode also having a rectangular configuration.

7. A piezoelectric filter of three terminal type which is especially adapted to vibrate primarily in an expansion mode, said filter comprising:
a piezoelectric substrate of a parallelogram configuration having first and second opposed main surfaces;
an input electrode and an output electrode respectively provided on said first main surface of said piezoelectric substrate, said input electrode also having a parallelogram configuration and provided in the vicinity of the central portion of said first main surface, and said output electrode being provided adjacent to peripheral edges of said first main surface in a concentrically spaced relation with respect to said input electrode; and
a common electrode provided on said second main surface of said piezoelectric substrate, said common electrode having a parallelogram configuration and confronting less than the entire said output electrode through said piezoelectric substrate whereby spurious edge mode vibrations which would otherwise be excited are suppressed.

8. A piezoelectric filter of three terminal type which is especially adapted to vibrate primarily in an expansion mode, said filter comprising:
a piezoelectric substrate of a parallelogram configuration having first and second opposed main surfaces;
an input electrode and an output electrode respectively provided on said first main surface of said piezoelectric substrate, said input electrode having a rectangular configuration and provided at one side of said first main surface so as to face said output electrode also having a rectangular configuration and provided at the other side of said first main surface in a spaced relation from said output electrode; and
a common electrode provided on said second main surface of said piezoelectric substrate, said common electrode having a rectangular configuration and confronting less than the entire said output electrode through said piezoelectric substrate whereby spurious edge mold vibration which would otherwise be excited are suppressed.

9. A piezoelectric filter as claimed in any one of claims 1, 2, 7 or 8, wherein said common electrode does not overlap any of said output electrode through said piezoelectric substrate.

10. A piezoelectric filter as claimed in any one of claims 1, 2, 7 or 8, wherein said common electrode overlaps no more than one-half of said output electrode through said piezoelectric substrate.

11. A piezoelectric filter according to any one of claims 1, 2, 7 or 8, wherein said common electrode confronts said output electrode through said piezoelectric substrate only at substantially the peripheral edge of said output electrode.

12. The combination of a piezoelectric filter according to any one of claims 1, 2, 7 or 8, and means for applying an electric signal to said input electrode of said filter, said electric signal having a frequency which will excite said piezoelectric filter to vibrate primarily in said expansion mode.

* * * * *